(12) United States Patent
Zhong et al.

(10) Patent No.: US 9,961,285 B2
(45) Date of Patent: May 1, 2018

(54) OPTICAL IMAGING METHOD USING SINGLE PIXEL DETECTOR

(71) Applicant: JINAN UNIVERSITY, guangzhou (CN)

(72) Inventors: Jingang Zhong, Guangzhou (CN); Zibang Zhang, guangzhou (CN); Xiao Ma, guangzhou (CN)

(*) Notice: Subject to any disclaimer, the term of this patent is extended or adjusted under 35 U.S.C. 154(b) by 0 days. days.

(21) Appl. No.: 15/317,942

(22) PCT Filed: May 29, 2015

(86) PCT No.: PCT/CN2015/080156
§ 371 (c)(1),
(2) Date: Dec. 11, 2016

(87) PCT Pub. No.: WO2016/015516
PCT Pub. Date: Feb. 4, 2016

(65) Prior Publication Data
US 2017/0134680 A1    May 11, 2017

(30) Foreign Application Priority Data
Jul. 29, 2014   (CN) .......................... 2014 1 0367541

(51) Int. Cl.
*H04N 5/369*    (2011.01)
*G01B 11/25*    (2006.01)

(52) U.S. Cl.
CPC ............. *H04N 5/369* (2013.01); *G01B 11/25* (2013.01)

(58) Field of Classification Search
CPC ........ G06T 1/0007; H04N 5/369; G01B 11/25
See application file for complete search history.

(56) References Cited

U.S. PATENT DOCUMENTS

| 2011/0068268 | A1* | 3/2011 | Heidari | G01N 21/3581 |
| | | | | 250/330 |
| 2015/0160613 | A1* | 6/2015 | Ferraro | G03H 1/0443 |
| | | | | 359/32 |

* cited by examiner

*Primary Examiner* — Ahmed A Berhan
(74) *Attorney, Agent, or Firm* — Wayne & Ken, LLC; Tony Hom (57) ABSTRACT

An optical imaging method using a single-pixel detector, An image of a target object is expressed by using discrete pixels, and the size of the image is M×N pixels. A cosine structured light field generator is used for generating a series of light fields that have different frequencies and are distributed according to cosine, wherein each set of frequencies corresponds to at least three different initial phase φ values; the light fields with cosine distribution that have different frequencies and different initial phases are used to sequentially irradiate the target object; an optical detector (2) is used for sequentially receiving light intensity signals from the target object and then response values of the optical detector (2) are sequentially collected and recorded; An image reconstruction algorithm is established on the basis of the light fields, the number of measurements can be greatly reduced, and a high-quality reconstructed image can be obtained.

6 Claims, 6 Drawing Sheets

OPTICAL IMAGING METHOD USING SINGLE PIXEL DETECTOR

TECHNICAL FIELD

The present invention relates to the technical field of optical imaging, and more specifically, to an optical imaging method using single-pixel detector.

BACKGROUND OF THE INVENTION

Image is human's primary information source, and optical imaging is the primary way to obtain images. An optical imaging system generally consists of an illumination unit and a detection unit. Performing optical imaging on a non-luminous target object by the conventional way is generally to illuminate the object with a stable and uniform illumination light field, and to collect the light reflected from the object surface through some lenses so as to form an image of the target object onto some photosensitive recording medium (such as photographic film, pixelated CCD camera, pixelated CMOS camera, and etc.). The performances of the utilized lens and photosensitive device are main factors to affect imaging quality. The resolution of the resultant images is subject to the pixel pitch of the utilized photosensitive device and the performance of the utilized lens. For higher image resolution, the pixel pitch should be smaller. However, photosensitive devices with small pixel pitch are commonly difficult to be manufactured and might reduce signal-to-noise ratio. Besides, the spectral characteristics of photosensitive device have larger difficulty for some imaging applications beyond visible waveband. For example, the existing CCD, CMOS and other imaging devices based on silicon-based semiconductor have difficulty in working over bands like infrared, terahertz, X-ray, and etc. In the conventional imaging model, only the light that is from target object and transmits through lenses without scattering in transmission from the object to the detector keeps the spatial information of the target object and with such light the image can be formed; however, the light that is scattered in transmission losses the spatial information of the target object has no contribution to imaging but to noise. Therefore, it is challenging to image a target object hidden behind any scattering media (such as, ground glass) by means of the conventional imaging.

Recently, people pay more attention to single-pixel imaging techniques, which has essential difference with conventional imaging techniques in terms of imaging mechanism. The single-pixel imaging techniques potentially allow one to break the limitations of classical imaging model in some special imaging applications. Single-pixel detectors (such as, photodiodes), instead of pixelated cameras, are utilized to collect light signals and computationally reconstruct images. As such, single-pixel imaging is an instance of computational imaging techniques. Contemporary single-pixel imaging techniques originate from ghost imaging which initially utilized quantum entanglement effect. [T. B. Pittman, Optical imaging by means of two-photon quantum entanglement. *Physical Review A*. 52, R3429 (1995).] And later, it was developed into single-pixel ghost imaging by using thermal light [R. S. Bennink, S. J. Bentley, R. W. Boyd, "Two-Photon" coincidence imaging with a classical source. *Physical Review Letters*. 89, 113601 (2002)], and single-pixel imaging based on compressed sensing [M. F. Duarte, M. A. Davenport, D. Takhar, J. N. Laska, T. Sun, K. F. Kelly, R. G. Baraniuk, Single-Pixel Imaging via Compressive Sampling. *IEEE Signal Processing Magazine*. 25, 83-91 (2008)].

Single-pixel imaging has been a hot research topic for over 10 years. However, the imaging quality of single-pixel imaging techniques is hardly comparable to that of existing conventional optical imaging techniques. Due to the probabilistic nature, single-pixel ghost imaging techniques use speckle light fields and compressive sampling based single-pixel imaging techniques use random patterns for illumination. However, neither the speckle patterns nor random patterns have a closed-form expression in mathematics. Such a probabilistic nature also leads to the facts that a great number (millions) of measurements are needed to reconstruct an image, and that the reconstruction result is only an approximation to the true one and the reconstruction quality is not comparable to that by conventional optical imaging techniques.

SUMMARY OF THE INVENTION

The purpose of the present invention is to solve the situation of poor imaging quality in existing single-pixel imaging technology, and provides an optical imaging method using a single-pixel detector with high quality, the technical core is to adopt light fields with a cosine spatial structure that have definite mathematical function analytical expression to replace speckle light field in ghost imaging technology with thermal light source; an image analytical reconstruction algorithm is established on the basis of the light fields, the number of measurements can be greatly reduced, and a high-quality reconstructed image can be obtained.

The technical scheme of the present invention is as, follows:

An optical imaging method is characterized in that the target object image is expressed by using a matrix of M×N pixels, and that the scene constituting the target object is in the actual size of $M\delta_x \times N\delta_y$, M and N are positive integers, and $\delta_x$ and $\delta_y$ are respectively geometrical dimensions of one pixel in x and y direction. The method is also characterized in that a structured light generator is used for generating the target object with a sequence of light fields that have different spatial frequencies to illuminate the target object. The intensity distribution of the light fields in the target object plane is subject to a cosine function $P(x, y; f_x, f_y) = a + b \cdot \cos(2\pi f_x x + 2\pi f_y y + \phi)$. a is the mean intensity, b is the contrast, both a and b are positive integers; x and y are pixel coordinates of the target object, x is an integer between $0 \square M-1$, and y is an integer between $0 \square N-1$; $f_x$ and $f_y$ are spatial frequencies in x and y direction respectively, $f_x$ and $f_y$ are normalized in the form of $$\frac{\alpha}{M} \text{ and } \frac{\beta}{N},$$

where $\alpha$ is an integer between $0 \square M-1$, and $\beta$ is an integer between $0 \square N-1$; $\phi$ is the initial phase; each spatial frequency pair $(f_x, f_y)$ corresponds to at least three different initial phase $\phi$ values. The method is characterized in that an optical detector is used for sequentially receiving light intensity signals from the target object and then response values of the optical detector are sequentially collected and recorded; the Fourier spectrum $D_{fp}(f_x, f_y)$ of the image of the target object image is obtained according to the response values; and two-dimensional discrete inverse Fourier transform is applied to the Fourier spectrum $D_{fp}(f_x, f_y)$, so as to reconstruct the image of the target object $I(x, y)$.

Further, each frequency pair $(f_x, f_y)$ corresponds to Q equal-step initial phases:

$$\phi = 0, \frac{2\pi}{Q}, \ldots, (Q-1)\frac{2\pi}{Q},$$

where Q is an integer greater than or equal to 3, and the response values of the optical detector sequentially received from the light intensity signals of the target object are expressed as $D_0(f_x, f_y), D_1(f_x, f_y), \ldots, D_{Q-1}(f_x, f_y)$, based on an equation $$D_{fp}(f_x, f_y) = \sum_{q=0}^{Q-1} D_q(f_x, f_y) \cdot \cos\left(\frac{2\pi q}{Q}\right) + j \sum_{q=0}^{Q-1} D_q(f_x, f_y) \cdot \sin\left(\frac{2\pi q}{Q}\right),$$

where $D_{fp}(f_x, f_y)$ is the Fourier spectrum of the target object image and j is the imaginary unit.

Each spatial frequency pair $(f_x, f_y)$ can also correspond to other initial phases and thus different equation for Fourier transform reconstruction. For example, if each set of frequency corresponds to three initial phases $$-\frac{\pi}{2}, 0, \text{ and } +\frac{\pi}{2},$$

the equation would be $$D_{fp}(f_x, f_y) = [2D_2(f_x, f_y) - D_1(f_x, f_y) - D_3(f_x, f_y)] + j \cdot [D_3(f_x, f_y) - D_1(f_x, f_y)],$$

where $D_{fp}(f_x, f_y)$ is the Fourier spectrum of the target object image is obtained and j is the imaginary unit.

Further, the object image is be reconstructed by applying a two-dimensional discrete inverse Fourier transform to the Fourier spectrum obtained, with the following equation $$I(x, y) = \sum_{f_x=0}^{(M-1)/M} \sum_{f_y=0}^{(N-1)/N} D_{fp}(f_x, f_y) \cdot \exp[j 2\pi(f_x x + f_y y)]$$

The method allows high-quality single-pixel imaging. Perfect reconstruction requires the Fourier spectrum to be fully obtained by using a larger number of measurements as the image pixels that the reconstructed image has. In practical applications, the number of measurements can be reduced by partly obtaining the Fourier spectrum, however, the quality of the reconstructed image would appear blur correspondingly.

The theoretical basis of the present invention is as follows:

A structured light field generator, such as projector and interferometer, is used for generating a sequence of light fields that have different spatial frequencies. The intensity distribution of the light fields in the target object plane is subject to the following equation:

$$P(x, y; f_x, f_y) = a + b \cdot \cos(2\pi f_x x + 2\pi f_y y + \phi) \quad (1)$$

where a is mean intensity of a light field, b is the contrast, $\phi$ is an initial phase; x and y are coordinates in the target object plane, $f_x$ and $f_y$ are spatial frequencies in x and y direction, respectively. The total intensity of the resultant reflected light from the target object under structured light illumination is:

$$E_\phi(f_x, f_y) = \iint_S R(x, y) P_\phi(x, y; f_x, f_y) dx dy \quad (2)$$

where $R(x, y)$ is the object surface reflectance and S is the area of illumination. A optical detector is used to collect the resultant reflected light from the target object. The response by the optical detector is:

$$D_\phi(f_x, f_y) = D_n + k \cdot E_\phi(f_x, f_y) \quad (3)$$

where $D_n$ is a background term caused by the ambient illumination and k is a factor related to the optical detector. For each spatial frequency pair, at least three light fields expressed by Equation (1) with different initial phase are to be generated and illuminated onto to the target object; a optical detector [such as, photodiode, photocell, photomultiplier, and pixelated camera (CCD or CMOS] is used for sequentially receiving light intensity signals from the target object and then responses of the optical detector are sequentially collected and recorded; the Fourier spectrum of the image of the target object is obtained according to the responses; and two-dimensional discrete inverse Fourier transform is applied to the obtained Fourier spectrum, so as to reconstruct the image of the target object.

Taking it as an example that the each spatial frequency pair corresponds to four different initial phases (0, $\pi/2$, $\pi$, and $3\pi/2$) and the light intensities of the light fields illuminated onto the surface of the target object are expressed as:

$$P_1(x, y; f_x, f_y) = a + b \cdot \cos(2\pi f_x x + 2\pi f_y y + 0) \quad (4)$$

$$P_2(x, y; f_x, f_y) = a + b \cdot \cos(2\pi f_x x + 2\pi f_y y + \pi/2) \quad (5)$$

$$P_3(x, y; f_x, f_y) = a + b \cdot \cos(2\pi f_x x + 2\pi f_y y + \pi) \quad (6)$$

$$P_2(x, y; f_x, f_y) = a + b \cdot \cos(2\pi f_x x + 2\pi f_y y + 3\pi/2) \quad (7)$$

When these four light fields sequentially are illuminated on the target object, the resultant responds of the optical detector are respectively expressed as $D_1(f_x, f_y)$, $D_2(f_x, f_y)$, $D_3(f_x, f_y)$, and $D_4(f_x, f_y)$. Based on the Equations (2) and (3), the following equation $$D_\phi(f_x, f_y) = D_n + a \cdot k \iint_S R(x, y) dx dy + b \cdot k \iint_S R(x, y) \cdot \cos(2\pi f_x x + 2\pi f_y y + \phi) dx dy \quad (8)$$

is obtained, and $$[D_1(f_x, f_y) - D_3(f_x, f_y)] + j \cdot [D_2(f_x, f_y) - D_4(f_x, f_y)] = \quad (9)$$

$$2b \cdot k \int \int_S R(x, y) \cdot$$

$$\{\cos[2\pi(f_x f + f_y y)] - j \cdot \sin[2\pi(f_x x + f_y y)]\} dx dy =$$

$$2b \cdot k \int \int_S R(x, y) \cdot \exp[-j \cdot 2\pi(f_x x + f_y y)] dx dy,$$

is also obtained, where j is the imaginary unit. Let $$C(f_x, f_y) = \iint_S R(x, y) \cdot \exp[-j \cdot 2\pi(f_x x + f_y y)] dx dy, \quad (10)$$

then $$R(x, y) = \int_{-\infty}^{\infty} \int_{-\infty}^{\infty} C(f_x, f_y) \exp[j 2\pi(f_x x + f_y y)] df_x df_y \quad (11)$$

$$= \frac{1}{2b \cdot k} \cdot \int_{-\infty}^{\infty} \int_{-\infty}^{\infty} D_{fp}(f_x, f_y) \cdot \exp[j \cdot 2\pi(f_x x + f_y y)] df_x df_y,$$

where $$D_{fp}(f_x, f_y) = \{[D_1(f_x, f_y) - D_3(f_x, f_y)] + j \cdot [D_2(f_x, f_y) - D_4(f_x, f_y)]\}. \quad (12)$$

According to Equation (11), the target object image I(x, y) can be reconstructed with:

$$I(x, y) = \int_{-\infty}^{\infty}\int_{-\infty}^{\infty} D_{fp}(f_x, f_y) \cdot \exp[j \cdot 2\pi(f_x x + f_y y)] df_x df_y \quad (13)$$
$$= 2b \cdot k \cdot R(x, y).$$

Obviously, Equation (13) describes the it of the target object is reconstructed by applying two-dimensional discrete inverse Fourier transform to the obtained Fourier spectrum $D_{fp}(f_x, f_y)$. The reconstructed image I(x, y) is proportional to the object surface reflectance R(x, y).

In actual, the image is discretely expressed. An image of a target object illuminated by light fields is expressed by using discrete pixels, that is, a matrix of M×N pixels. The actual size of the scene consisting of the target object is in the shape of a rectangle whose size is $M\delta_x \times N\delta_y$, where M and N are positive integers, and $\delta_x \times \delta_y$ is a geometrical dimension of one pixel. The Fourier spectrum of the image of the target object is also discretized into a matrix of M×N pixels. The spatial frequencies and $f_x$ and $f_y$ corresponding to each matrix element are respectively normalized to $$\frac{\alpha}{M} \text{ and } \frac{\beta}{N},$$

where α is an integer number between 0☐M−1, and β is an integer number between 0☐N−1.

Compared with prior art, the present invention adopts light fields with a cosine spatial structure that have definite mathematical function analytical expression to replace the speckle light field in thermal source ghost imaging technology, an image analytical reconstruction algorithm is established on the basis of the light fields, the number of measurements can be greatly reduced, and a high-quality reconstructed image can be obtained.

DETAILED DESCRIPTION OF THE INVENTION

Figure 1:
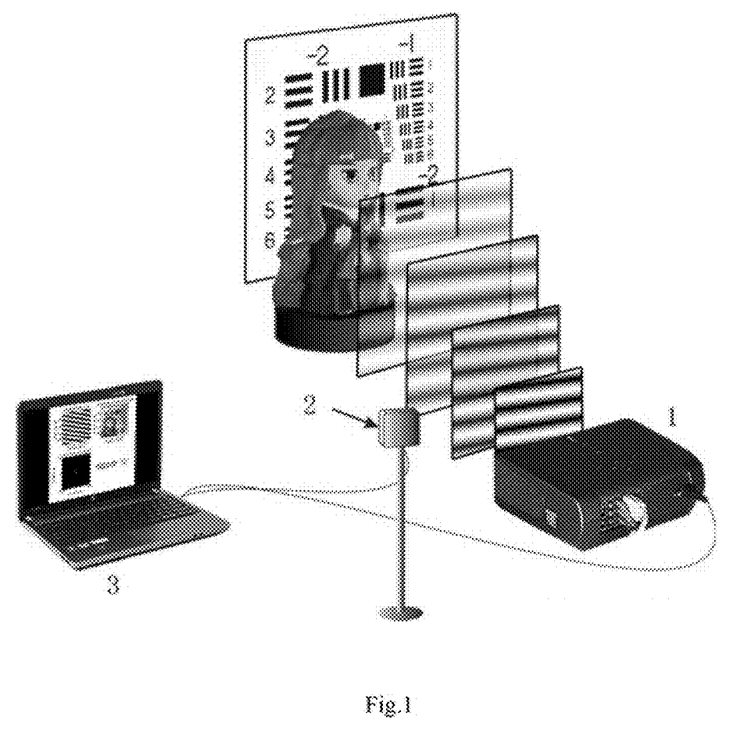
FIG. 1 is a schematic diagram of the experimental set-up.

FIG. 1 is a schematic diagram of the experimental device, a computer 3 is used for generating a series of light fields that have different frequencies and are distributed according to cosine, and these light fields are projected onto the target object through a digital projector 1, light intensity signals are collected by an optical detector 2 and transmitted to the computer for processing.

Figure 2:
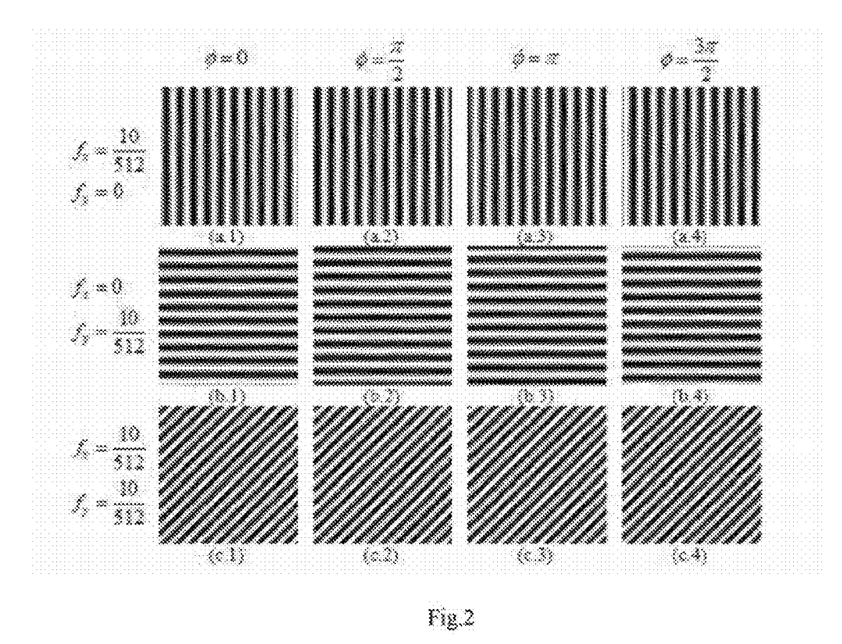
FIG. 2 is three examples of cosine distributed pattern.

FIG. 2 is three examples of patterns in projection, showing different spatial frequency combination and initial phase.

Embodiment 1

The image of the target object under structured light illumination is expressed by using a matrix of M×N pixels. The actual size of the scene consisting of the target object is in the shape of a rectangle whose size is $M\delta_x \times N\delta_y$, M and N are positive integers, and $\delta_x \times \delta_y$ is a geometrical dimension of one pixel. The Fourier spectrum of the image of the target object is also discretized into a matrix of M×N pixels. The spatial frequencies $f_x$ and $f_y$ corresponding to each matrix element are respectively normalized to $$\frac{\alpha}{M} \text{ and } \frac{\beta}{N},$$

where α is an integer number between 0☐M−1, and β is an integer number between 0☐N−1. A digital projector is used as a structured light field generator. The computer controls the digital projector to generate the light fields. Each spatial frequency pair corresponds to four light fields with different initial phases (0, π/2, π and 3π/2). The light fields are illuminated onto the target object sequentially.

A single-pixel detector is used for imaging of a complex scene by the method of the present invention. The experimental set-up is as FIG. 1 shows. The structured light patterns are generated by the computer (as shown in FIG. 2), and are transmitted to the digital projector (Toshiba Tp-95), so as to form illuminating light field, and form clear image of cosine-striped pattern on surface of object to be imaged. The structured light patterns are of 245×245 pixels, (that is M=245, and N=245). The mean intensity a is 127.5 (for achievable brightness range is from 0 to 255. The contrast b is 127.5. The actual size of the scene that consists of the target object is a square of $(245 \times 0.65)^2$ mm² (that is, $\delta_x = 0.65$ mm and $\delta_y = 0.65$ mm), x is an integer between 0 and 244 and y is an integer between 0 and 244. $f_x$ and $f_y$ are spatial frequencies x and y direction respectively. $f_x$ and $f_y$ are normalized to be $$\frac{\alpha}{245} \text{ and } \frac{\beta}{245},$$

where α is an integer between 0 and 244, and β is an integer between 0 and 244. A photodiode (Hamamatsu S1227-1010BR) is used as a single-pixel detector to collect resultant light signals from the scene. The photodiode is driven by an amplifying circuit. The output electric signal is collected by data acquisition card (Native Instrument PCI-6220 DAQ) of the computer. The persistence length for projecting each pattern by projector is 0.15 second. The photodiode collects the light signals synchronously. The computer utilizes the data acquisition card to reconstruct the Fourier spectrum of the image with the collected electric signals based on the following equation $$D_{fp}(f_x, f_y) = \{[D_1(f_x, f_y) - D_3(f_x, f_y)] + j \cdot [D_2(f_x, f_y) - D_4(f_x, f_y)]\}$$

Figure 3:
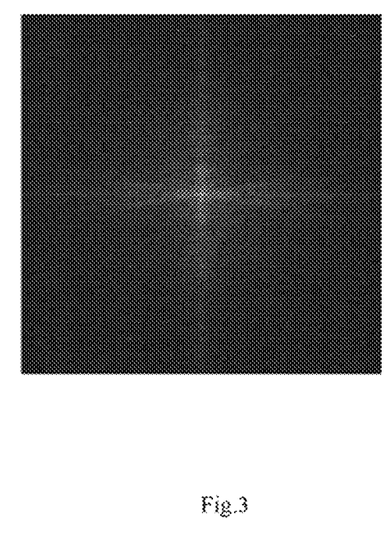
FIG. 3 is two-dimensional Fourier spectrum of image obtained by embodiment 1.

As shown in FIG. 3, the largest spatial frequencies $f_x$ and $f_y$ are respectively $$\frac{244}{245} \text{ and } \frac{244}{245}.$$

Figure 4:
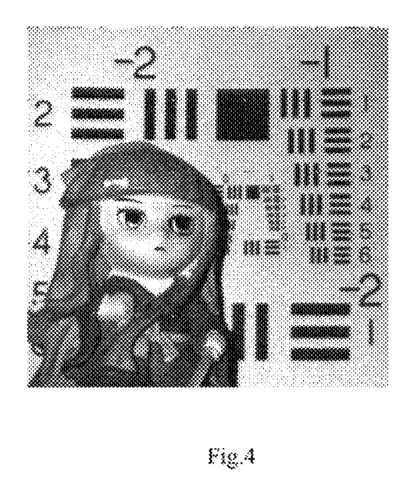
FIG. 4 is reconstructed image result of embodiment 1.

Two-dimensional discrete inverse Fourier transform is applied to the obtained Fourier spectrum and consequently the final image shown in FIG. 4 is reconstructed. As described above, $f_x$ and $f_y$ are normalized to be $$\frac{\alpha}{245} \text{ and } \frac{\beta}{245}.$$

Figure 5:
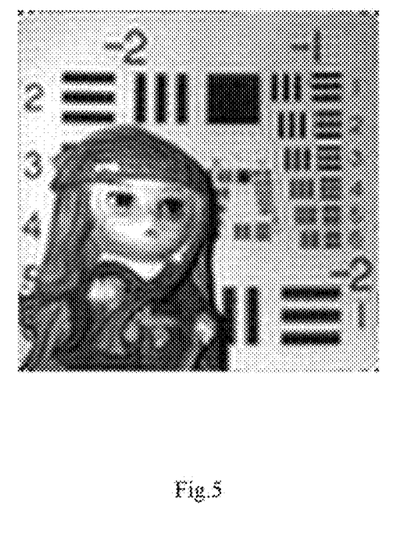
FIG. 5 is reconstructed image result of embodiment 1 in less projection times.
Figure 6:
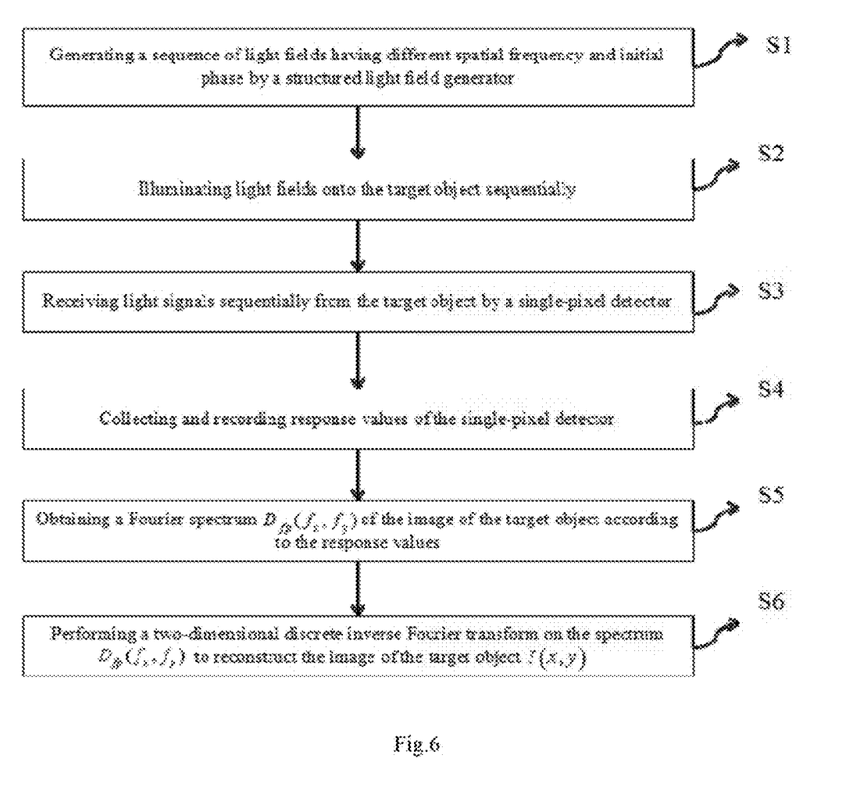
FIG. 6 is a flow diagram of the optical imaging method.

If $\alpha$ is an integer of 0~77, and $\beta$ is an integer of 0~77, corresponding Fourier spectrum can also be obtained (the total amount of spectral points accounts for about 10% of FIG. 3, that is, the total amount of projection is 10% of FIG. 3), the image can also be reconstructed by two-dimensional discrete inverse Fourier transform, as shown in FIG. 5, however, the quality of the image is obviously poorer than FIG. 4.

The invention claimed is:

1. An optical imaging method using a single-pixel detector, an image of a target object is expressed by using a matrix of M×N pixels; the actual size of the scene constituting the target object is in the shape of a rectangle having a size of $M\delta_x \times N\delta_y$, where M and N are positive integers, and $\delta_x \times \delta_y$ is a geometrical dimension of one pixel in x and y direction, characterized in that the method comprising:

generating a sequence of light fields having different spatial frequency and initial phase by a structured light field generator; wherein an intensity of the light fields is distributed according to a cosine function; the light intensity distribution of a light field in the target object plane is $P(x, y; f_x, f_y) = a + b \cdot \cos(2\pi f_x x + 2\pi f_y y + \phi)$, wherein a is a mean intensity of the light field; b is a contrast; a and b are positive numbers; x and y are pixel coordinates in the target object plane, x is an integer between 0~M−1, y is an integer between 0~N−1; $f_x$ and $f_y$ are respectively frequencies in x and y direction, $f_x$ and $f_y$ are normalized to be $$\frac{\alpha}{M} \text{ and } \frac{\beta}{N};$$

where $\alpha$ is an integer between 0~M−1, and $\beta$ is an integer between 0~N−1; $\phi$ is an initial phase; each spatial frequency pair $(f_x, f_y)$ corresponds to at least three different initial phase $\phi$ values;

illuminating light fields onto the target object sequentially; wherein the intensity of the light fields is distributed according to a cosine function with different frequency and different initial phase;

receiving light signals sequentially from the target object by a single-pixel detector and then collecting and recording response values of the single-pixel detector;

obtaining a Fourier spectrum $D_{fp}(f_x, f_y)$ of the image of the target object according to the response values; and performing a two-dimensional discrete inverse Fourier transform on the spectrum $D_{fp}(f_x, f_y)$ to reconstruct the image of the target object $I(x, y)$.

2. The optical imaging method using a single-pixel detector according to claim 1, characterized in that each of the spatial frequency pair $(f_x, f_y)$ frequency corresponds to Q equal step initial phases:

$$\phi = 0, \frac{2\pi}{Q}, \ldots, (Q-1)\frac{2\pi}{Q};$$

wherein Q is an integer greater than or equal to 3, and the response values of the single-pixel detector sequentially received from the light signals of the target object are expressed as $D_0(f_x, f_y), D_1(f_x, f_y), \ldots, D_{Q-1}(f_x, f_y)$, based on an equation $$D_{fp}(f_x, f_y) = \sum_{q=0}^{Q-1} D_q(f_x, f_y) \cdot \cos\left(\frac{2\pi q}{Q}\right) + j\sum_{q=0}^{Q-1} D_q(f_x, f_y) \cdot \sin\left(\frac{2\pi q}{Q}\right);$$

the Fourier spectrum $D_{fp}(f_x, f_y)$ of the image of the target object is obtained, and j is an imaginary unit.

3. The optical imaging method using a single-pixel detector according to claim 2, characterized in that an inverse Fourier transform is performed on the Fourier-transformed spectrum $D_{fp}(f_x, f_y)$ based on an equation $$I(x, y) = \sum_{f_x=0}^{(M-1)/M} \sum_{f_y=0}^{(N-1)/N} D_{fp}(f_x, f_y) \cdot \exp[j2\pi(f_x x + f_y y)]$$

wherein j is an imaginary unit.

4. The optical imaging method using a single-pixel detector according to claim 1, characterized in that each of the spatial frequency pair $(f_x, f_y)$ corresponds to three initial phases $$-\frac{\pi}{2}, 0, \text{ and } +\frac{\pi}{2},$$

and the response values of the single-pixel detector sequentially received from the light signals of the target object are respectively expressed as $D_1(f_x, f_y), D_2(f_x, f_y),$ and $D_3(f_x, f_y)$, based on an equation $$D_{fp}(f_x, f_y) = [2D_2(f_x, f_y) - D_1(f_x, f_y) - D_3(f_x, f_y)] + j \cdot [D_3(f_x, f_y) - D_1(f_x, f_y)];$$

the Fourier spectrum $D_{fp}(f_x, f_y)$ of the image of the target object is obtained, and j is an imaginary unit.

5. The optical imaging method using a single-pixel detector according to claim 4, characterized in that an inverse Fourier transform is performed on the Fourier-transformed spectrum $D_{fp}(f_x, f_y)$ based on an equation $$I(x, y) = \sum_{f_x=0}^{(M-1)/M} \sum_{f_y=0}^{(N-1)/N} D_{fp}(f_x, f_y) \cdot \exp[j2\pi(f_x x + f_y y)]$$

wherein j is an imaginary unit.

6. The optical imaging method using a single-pixel detector according to claim 1, characterized in that an inverse Fourier transform is performed on the Fourier-transformed spectrum $D_{fp}(f_x, f_y)$ based on an equation $$I(x, y) = \sum_{f_x=0}^{(M-1)/M} \sum_{f_y=0}^{(N-1)/N} D_{fp}(f_x, f_y) \cdot \exp[j2\pi(f_x x + f_y y)]$$

wherein j is an imaginary unit.

* * * * *